US008350368B2

United States Patent
Chi et al.

(10) Patent No.: US 8,350,368 B2
(45) Date of Patent: Jan. 8, 2013

(54) SEMICONDUCTOR DEVICE AND METHOD OF FORMING SHIELDING LAYER AFTER ENCAPSULATION AND GROUNDED THROUGH INTERCONNECT STRUCTURE

(75) Inventors: HeeJo Chi, Daejeon-si (KR); NamJu Cho, Gyeonggi-do (KR); HanGil Shin, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/209,620

(22) Filed: Aug. 15, 2011

(65) Prior Publication Data

US 2011/0298105 A1    Dec. 8, 2011

Related U.S. Application Data

(63) Continuation of application No. 12/434,367, filed on May 1, 2009, now Pat. No. 8,018,034.

(51) Int. Cl.
*H01L 21/56* (2006.01)
*H01L 23/552* (2006.01)

(52) U.S. Cl. . 257/660; 257/666; 257/678; 257/E23.114; 257/E23.116; 257/659; 438/126; 438/127

(58) Field of Classification Search .......... 257/678–733, 257/787–796, E23.001–E23.194, 660–666
See application file for complete search history.

(56) References Cited

U.S. PATENT DOCUMENTS

| 6,914,189 B1 | 7/2005 | Ling et al. |
| 7,261,596 B2 | 8/2007 | Akaike et al. |
| 2007/0155048 A1 | 7/2007 | Lee et al. |
| 2009/0152688 A1 | 6/2009 | Do et al. |
| 2010/0109132 A1 | 5/2010 | Ko et al. |

*Primary Examiner* — Mamadou Diallo
(74) *Attorney, Agent, or Firm* — Robert D. Atkins; Patent Law Group: Atkins & Associate, P.C.

(57) ABSTRACT

A method of manufacturing a semiconductor device includes providing a substrate having a conductive bump formed over the substrate and a semiconductor die with an active surface oriented to the substrate. An encapsulant is deposited over the semiconductor die and the conductive bump, and the encapsulant is planarized to expose a back surface of the semiconductor die opposite the active surface while leaving the encapsulant covering the conductive bump. A channel is formed into the encapsulant to expose the conductive bump. The channel extends vertically from a surface of the encapsulant down through the encapsulant and into a portion of the conductive bump. The channel extends through the encapsulant horizontally along a length of the semiconductor die. A shielding layer is formed over the encapsulant and the back surface of the semiconductor die. The shielding layer includes a docking pin extending into the channel and into the portion of the conductive bump to electrically connect to the conductive bump and provide isolation from inter-device interference.

27 Claims, 7 Drawing Sheets

SEMICONDUCTOR DEVICE AND METHOD OF FORMING SHIELDING LAYER AFTER ENCAPSULATION AND GROUNDED THROUGH INTERCONNECT STRUCTURE

CLAIM OF DOMESTIC PRIORITY

The present application is a continuation of U.S. patent application Ser. No. 12/434,367, filed May 1, 2009, and claims priority to the foregoing parent application pursuant to 35 U.S.C. §120.

FIELD OF THE INVENTION

The present invention relates in general to semiconductor devices and, more particularly, to a semiconductor device and method of mounting a shielding layer after the encapsulant is deposited over a semiconductor die for isolation from electromagnetic interference (EMI) and radio frequency interference (RFI), or other inter-device interference. The shielding layer is grounded through an interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired EMI, RFI, or other inter-device interference, such as capacitive, inductive, or conductive coupling.

To reduce EMI, RFI, and other inter-device interference, a shielding layer can be formed over the semiconductor die. The shielding layer is typically mounted prior to encapsulation of the semiconductor die. The encapsulant is deposited over the shielding layer and pressed through holes or openings in the shielding layer into the gap between the shielding layer and semiconductor die to encase the die. However, the shielding layer poses an obstacle to the even flow of encapsulant which can leave voids around the semiconductor die. In addition, the shielding layer has been known to delaminate from the encapsulant, which can reduce device performance.

SUMMARY OF THE INVENTION

A need exists to isolate semiconductor die from EMI, RFI, and other inter-device interference while sealing the semiconductor die with encapsulant without voids. Accordingly, in one embodiment, the present invention is a method of making a semiconductor device including the steps of providing a substrate having a conductive bump formed over the substrate and a semiconductor die with an active surface oriented to the substrate, depositing an encapsulant over the semiconductor die and the conductive bump, and planarizing the encapsulant to expose a back surface of the semiconductor die opposite the active surface while leaving the encapsulant covering the conductive bump. A channel is formed into the encapsulant to expose the conductive bump. The channel extends vertically from a surface of the encapsulant down through the encapsulant and into a portion of the conductive bump. The channel extends through the encapsulant horizontally along a length of the semiconductor die.

In another embodiment, the present invention is a method of making a semiconductor device comprising the steps of providing a substrate having an interconnect structure formed over the substrate and a semiconductor component mounted to the substrate, depositing an encapsulant over the semiconductor component and interconnect structure, and forming a channel into the encapsulant to expose the interconnect structure. The channel extends vertically from a surface of the encapsulant down through the encapsulant and into a portion of the interconnect structure. The channel extends through the encapsulant horizontally along a length of the semiconductor component.

In another embodiment, the present invention is a method of making a semiconductor device comprising the steps of depositing an encapsulant over an interconnect structure and over a semiconductor component, wherein the interconnect structure and the semiconductor component are disposed over a substrate. The method further comprises forming a channel in the encapsulant to expose the interconnect structure. The channel extends vertically from a surface of the encapsulant down through the encapsulant to the interconnect structure, and the channel extends through the encapsulant horizontally along a length of the semiconductor component. The method further comprises forming a shielding layer over the encapsulant, wherein the shielding layer is electrically connected to the interconnect structure.

In another embodiment, the present invention is a semiconductor device comprising a substrate, an interconnect structure disposed over the substrate, and a semiconductor component mounted to the substrate. The semiconductor device further comprises an encapsulant deposited over the semiconductor component and the interconnect structure, and a channel disposed in the encapsulant. The channel extends vertically from a surface of the encapsulant down to the interconnect structure, and the channel extends horizontally along a length of the semiconductor component. The semiconductor device further comprises a shielding layer disposed over the encapsulant and the semiconductor component. The shielding layer is electrically connected to the interconnect structure to provide isolation from inter-device interference.

DETAILED DESCRIPTION OF THE DRAWINGS

Figure 1:
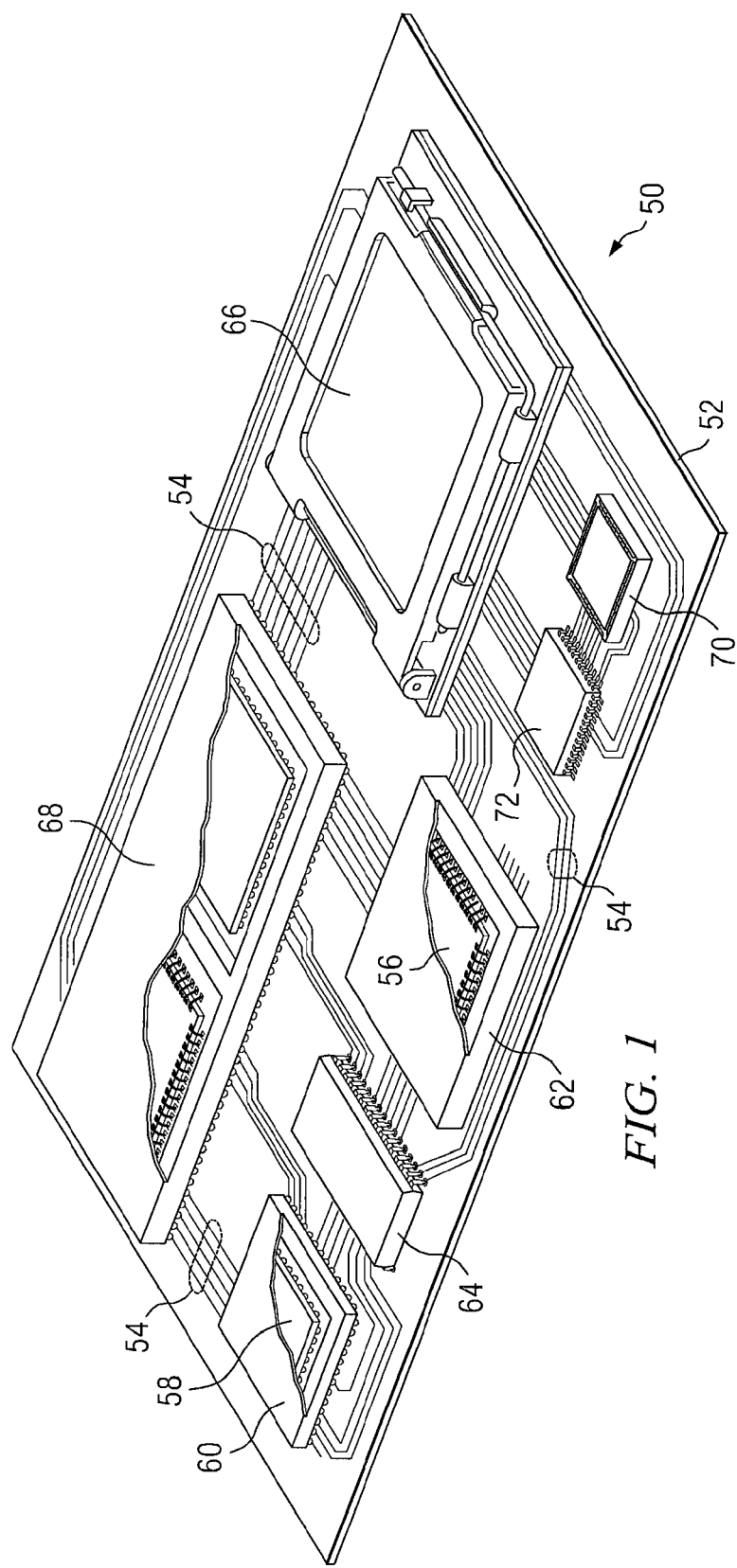
FIG. 1 illustrates a PCB with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
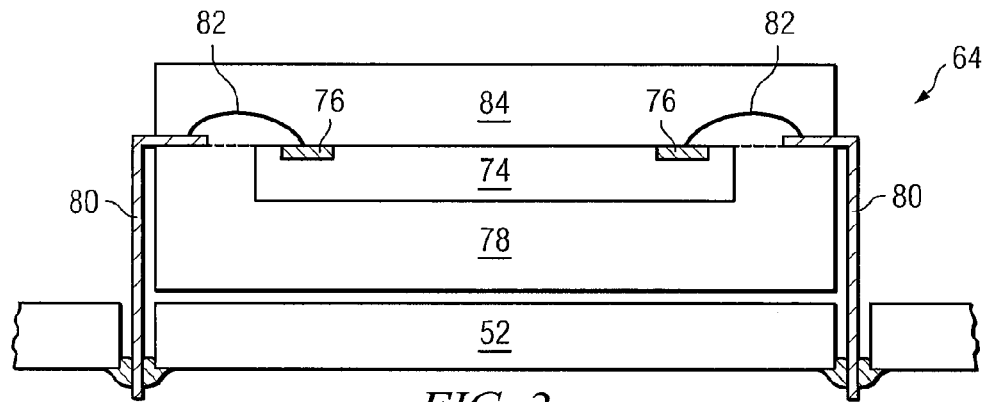
FIGS. 2a-2c illustrate further detail of the representative semiconductor packages mounted to the PCB.
Figure 2B:
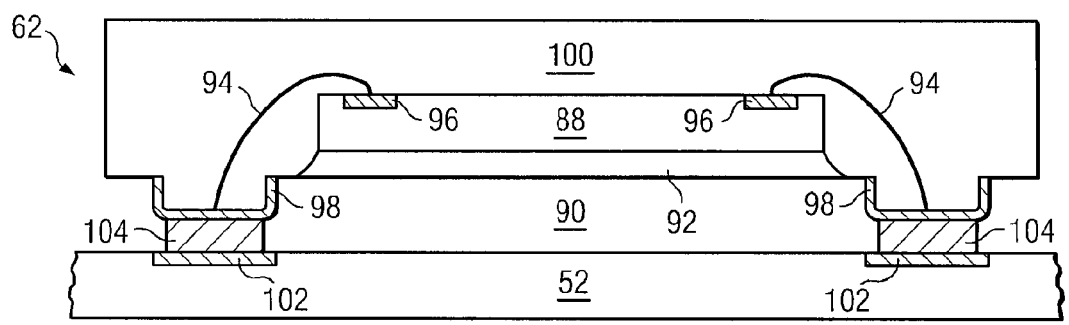
Figure 2C:
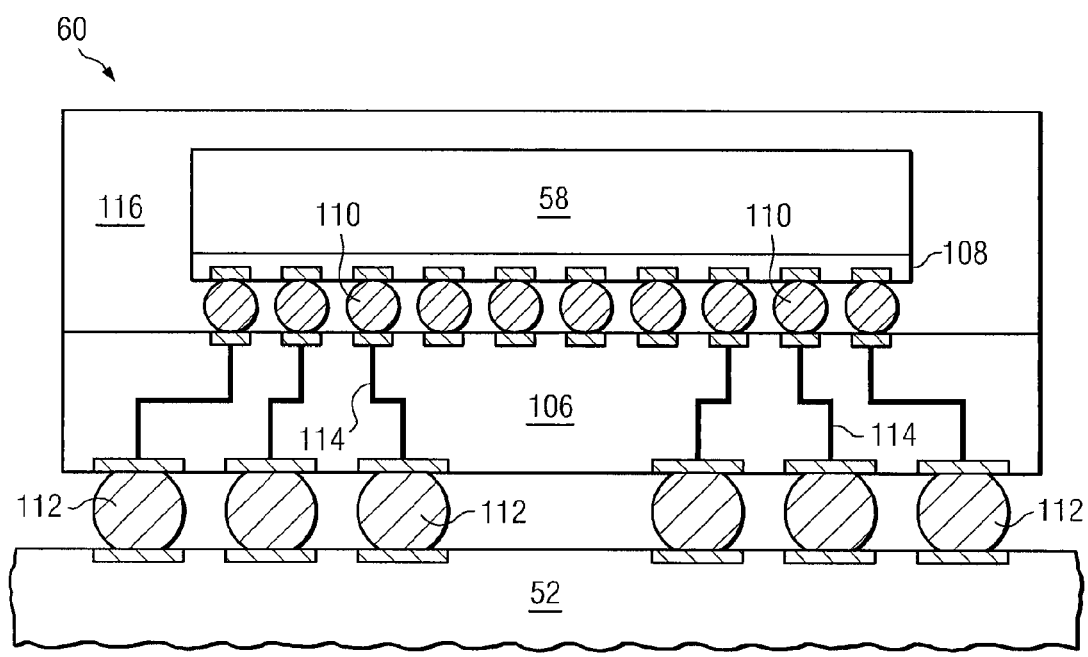

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Solder material is deposited between contact pads 98 of BCC 62 and contact pads 102 of PCB 52 and reflowed to form bumps 104 which form a mechanical and electrical connection between BCC 62 and PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically attached to carrier 106 through solder bumps or balls 110.

BGA 60 is electrically and mechanically attached to PCB 52 with a BGA style second level packaging using solder bumps or balls 112. Semiconductor die 58 is electrically connected to conductive signal traces 54 in PCB 52 through solder bumps 110, signal lines 114, and solder bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically attached directly to PCB 52 using flip chip style first level packaging without intermediate carrier 106.

Figure 3A:
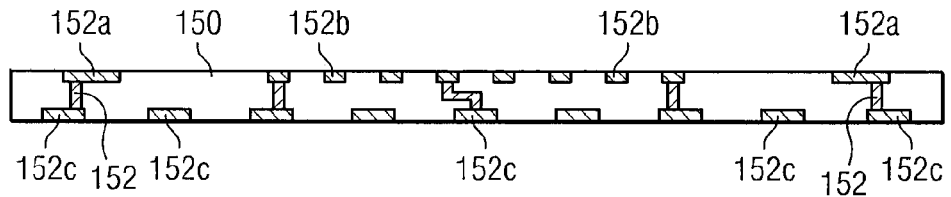
FIGS. 3a-3h illustrate a process of forming a shielding layer over a semiconductor die after encapsulation and grounded through solder bumps.
Figure 3B:
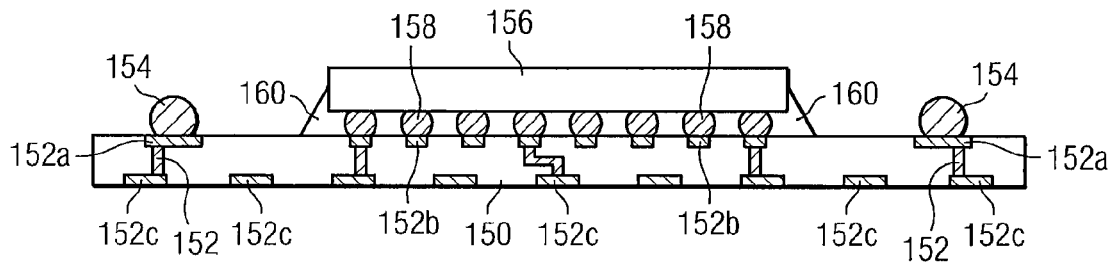

FIGS. 3a-3h illustrate a process of forming a semiconductor device with a shielding layer mounted over semiconductor die after encapsulation. In FIG. 3a, a substrate or carrier 150 contains base material such as silicon, metal leadframe, ceramic, tape, or other suitable rigid material for structural support. An electrically conductive layer 152 is formed within substrate 150 using patterning with PVD, CVD, sputtering, electrolytic plating, electroless plating process, or other suitable metal deposition process. Conductive layer 152 can be one or more layers of Al, Cu, Sn, Ni, Au, Ag, or other suitable electrically conductive material. Conductive layer 152 provides signal traces and contact pads which are electrically common or electrically isolated depending on the functional design of the device.

An electrically conductive solder material is deposited over contact pads 152a using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 154. In some applications, solder bumps 154 are reflowed a second time to improve electrical connection to contact pads 152a. Solder bumps 154 represent one type of interconnect structure that can be formed over contact pads 152a. The interconnect structure can also use conductive pillars, stud bump, micro bump, or other electrical interconnect.

A semiconductor die or component 156 is mounted over substrate 150 and electrically connected to conductive layer 152b with solder bumps 158. An optional underfill material 160 is deposited between semiconductor die 156 and substrate 150. Semiconductor die 156 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as digital signal processor (DSP), ASIC, memory, or other signal processing circuit. Semiconductor die 156 may also contain IPD, such as inductors, capacitors, and resistors, for RF signal processing. Semiconductor die 156 can be a flipchip type device or wire bond type device. In another embodiment, a discrete component can be mounted over and electrically connected to conductive pads 152b.

The IPDs in semiconductor die 156 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device.

A typical RF system requires multiple IPDs and other high frequency circuits in one or more semiconductor packages to perform the necessary electrical functions. The high frequency electrical devices generate or are susceptible to undesired EMI, RFI, or other inter-device interference, such as capacitive, inductive, or conductive coupling, also known as cross-talk, which can interfere with the operation of adjacent or nearby circuit elements.

Figure 3C:
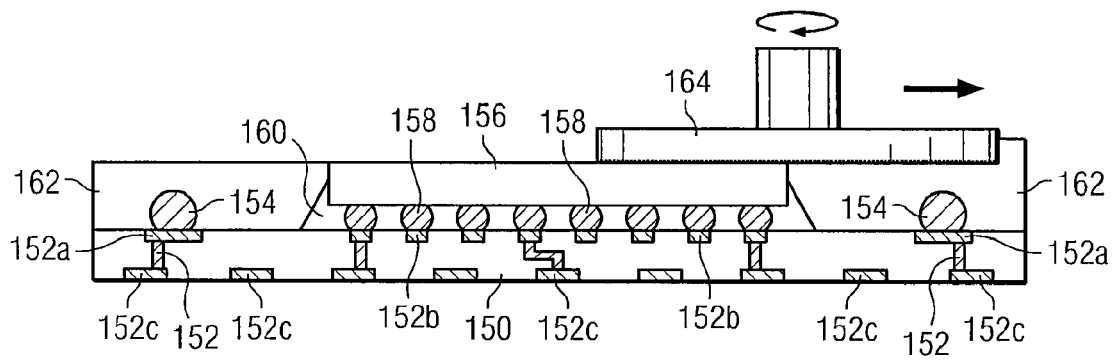

FIG. 3c shows an encapsulant or molding compound 162 deposited over carrier 150, semiconductor die 156, and around solder bumps 158 using a paste printing, compressive molding, transfer molding, liquid encapsulant molding, vacuum lamination, or other suitable applicator. Encapsulant 162 can be polymer composite material, such as epoxy resin with filler, epoxy acrylate with filler, or polymer with proper filler.

Encapsulant 162 is non-conductive and environmentally protects the semiconductor device from external elements and contaminants.

A portion of encapsulant 162 is removed with grinder 164 to planarize its surface with a backside of semiconductor die 156. Alternatively, the volume deposition of encapsulant 162 is controlled to a thickness that is planar with the backside of semiconductor die 156.

Another portion of encapsulant 162 is removed to form a groove or channel 168 using a saw blade, film assist molding (FAM), or laser ablation. Channel 168 extends down to solder bump 154. FIG. 3e shows a top view of the structure in FIG. 3d formed by FAM. FIG. 3f shows an alternative structure formed by a saw blade performing a partial cut. Solder bumps 154 are formed around semiconductor die 154. An electrically conductive layer 170 is formed within channel 168 using patterning with PVD, CVD, sputtering, electrolytic plating, electroless plating process, or other suitable metal deposition process. Conductive layer 170 can be one or more layers of Al, Cu, Sn, Ni, Au, Ag, or other suitable electrically conductive material. Alternatively, conductive layer 170 is a conductive paste that partially fills channel 168. Conductive layer 170 is electrically connected to solder bumps 154.

Figure 3D:
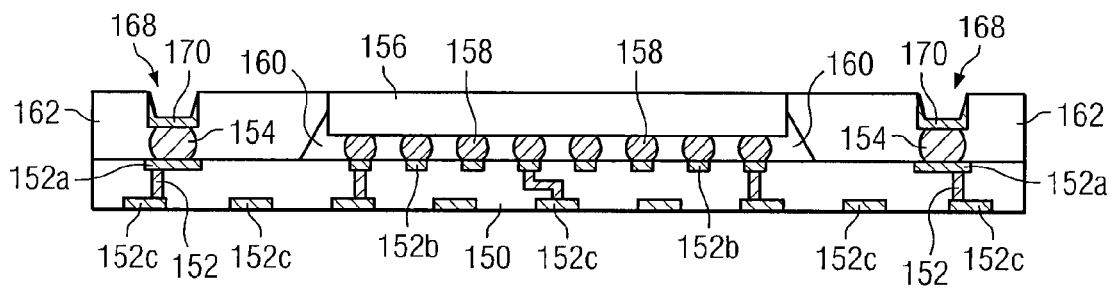
Figure 3E:
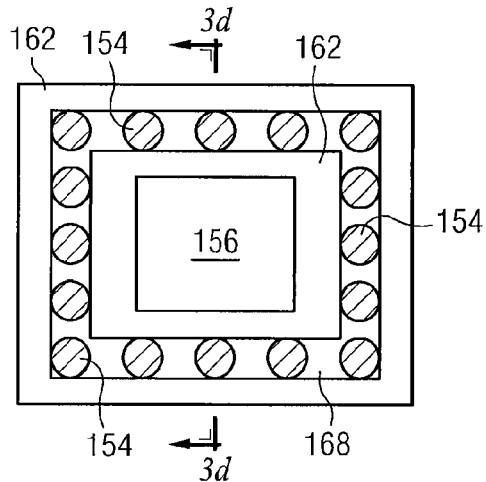
Figure 3F:
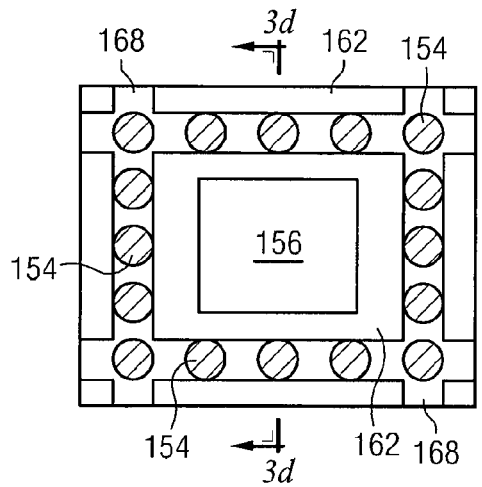
Figure 3G:
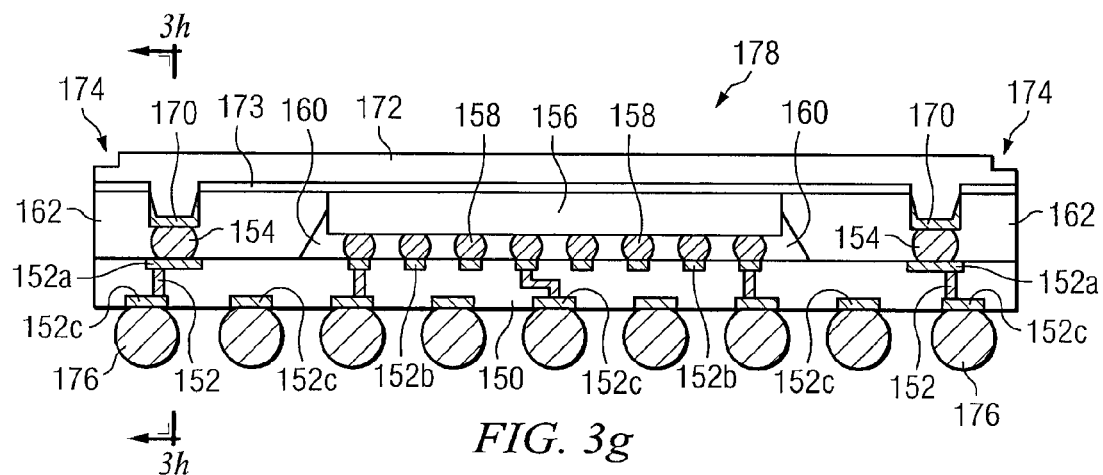

In FIG. 3g, an electrically conductive solder material is deposited over contact pads 152c using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 176. In some applications, solder bumps 176 are reflowed a second time to improve electrical connection to contact pads 152c. Solder bumps 176 represent one type of interconnect structure that can be formed over contact pads 152c. The interconnect structure can also use conductive pillars, stud bump, micro bump, or other electrical interconnect.

To reduce inter-device interference, a shielding layer 172 is formed over or mounted to encapsulant 162 and semiconductor die 156 with adhesive layer 173. Shielding layer 172 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 172 can also be a non-metal material such as carbon-black or aluminum flake to reduce the effects of EMI and RFI. Shielding layer 172 is electrically connected to conductive layer 170 and thermally contacts the backside of semiconductor die 156. Shielding layer 172 is electrically connected to a low-impedance ground point through conductive layers 152 and 170 and solder bumps 154 and 176. A chamfer area 174 can be formed around a perimeter of shielding layer 172. A thermal interface material can be applied to the back surface of semiconductor die 156 prior to forming shielding layer 172. The thermal interface material aids in the distribution and dissipation of heat generated by semiconductor die 156 across shielding layer 172.

Figure 3H:
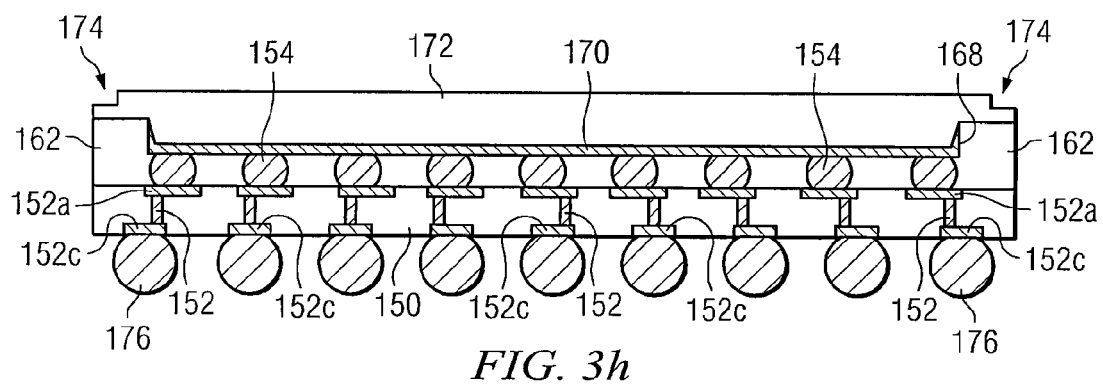

FIG. 3h is a cross-sectional view taken through the portion of shielding layer 172 in channel 168. Since encapsulant 162 is deposited before shielding layer 172, the shielding layer presents no obstacle to the flow of encapsulant 162 over semiconductor die 156. No voids are formed in the encapsulant as found in the prior art. Shielding layer 172 is more reliable and has less chance of delamination from the encapsulant. Shielding layer 172 has reliable joint connection to the external ground point.

Figure 4:
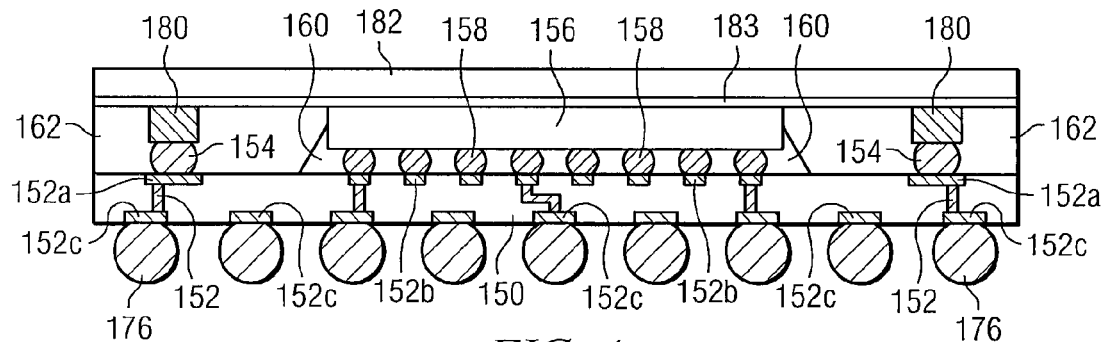
FIG. 4 illustrates the shielding layer mounted over the semiconductor die and grounded through the solder bumps.

An alternate embodiment is shown in FIG. 4. After FIG. 3c, groove or channel 168 is formed in encapsulant 162 and then completely filled with conductive paste 180. Shielding layer 182 is formed over or mounted to the planar surfaces of encapsulant 162 and semiconductor die 156 with adhesive layer 183. Shielding layer 182 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 182 can also be a non-metal material such as carbon-black or aluminum flake to reduce the effects of EMI and RFI. Shielding layer 182 is electrically connected to conductive paste 180 and thermally contacts the backside of semiconductor die 156. Shielding layer 182 is electrically connected to a low-impedance ground point through conductive layers 152 and 180 and solder bumps 154 and 176.

Figure 5A:
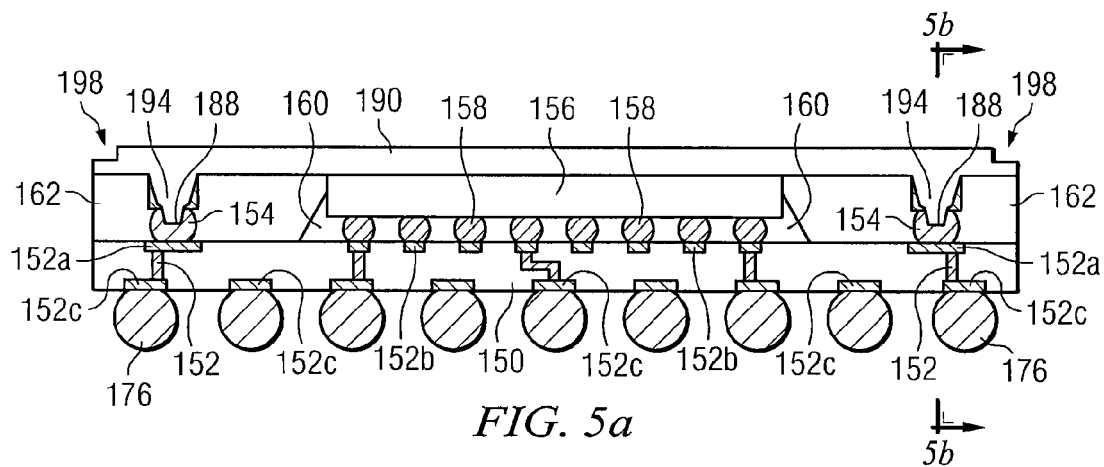
FIGS. 5a-5b illustrate the shielding layer mounted to the solder bumps with docking pins.

In another embodiment, after FIG. 3d, a deeper groove or channel 188 is cut into solder bumps 154, as shown in FIG. 5a. Shielding layer 190 is formed over or mounted to the planar surfaces of encapsulant 162 and semiconductor die 156. Shielding layer 190 has docking pins 194 for locking into solder bumps 154 to form a reliable connection. Shielding layer 190 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 190 can also be a non-metal material such as carbon-black or aluminum flake to reduce the effects of EMI and RFI. Shielding layer 190 is electrically connected to solder bumps 154 through channel 188 and thermally contacts the backside of semiconductor die 156. Shielding layer 190 is electrically connected to a low-impedance ground point through conductive layer 152 and solder bumps 154 and 176. A chamfer area 198 can be formed around a perimeter of shielding layer 190. A thermal interface material can be applied to the back surface of semiconductor die 156 prior to forming shielding layer 190. The thermal interface material aids in the distribution and dissipation of heat generated by semiconductor die 156 across shielding layer 190.

Figure 5B:
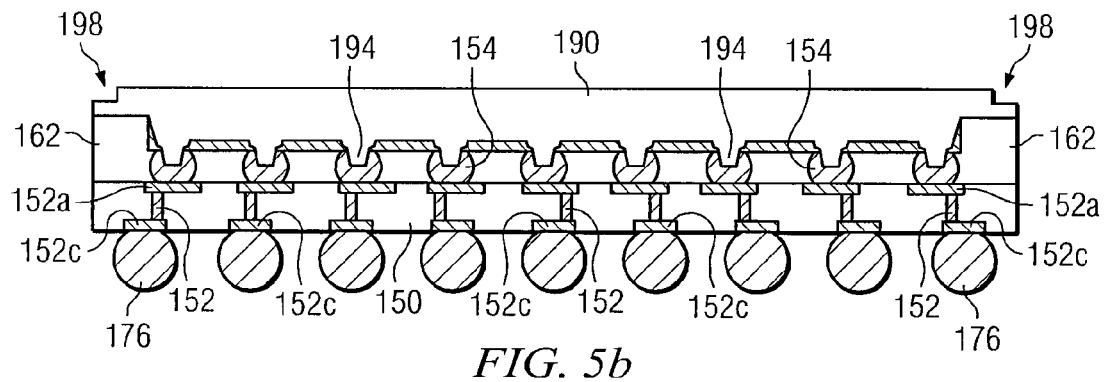

FIG. 5b is a cross-sectional view taken through docking pins 194 in channel 188. Since encapsulant 162 is deposited before shielding layer 190, the shielding layer presents no obstacle to the flow of encapsulant 162 over semiconductor die 156. No voids are formed in the encapsulant as found in the prior art. Shielding layer 190 is more reliable and has less chance of delamination from the encapsulant. Shielding layer 190 has reliable joint connection to the external ground point.

Figure 6A:
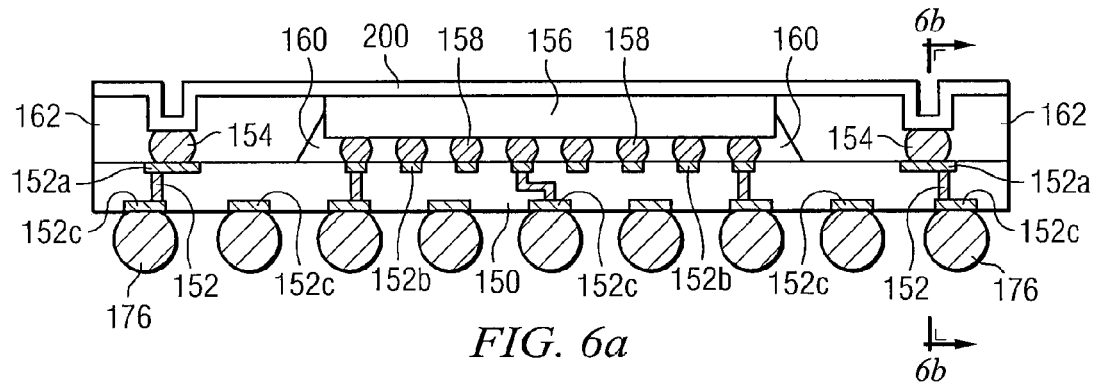
FIGS. 6a-6b illustrate the shielding layer conformally applied over the encapsulant and semiconductor die.

In another embodiment, after FIG. 3d, a shielding layer 200 is conformally applied over semiconductor die 156 and encapsulant 162 into channel 168 by spray coating, electroless plating, or electro plating, as shown in FIG. 6a. Shielding layer 200 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 200 can also be a non-metal material such as carbon-black or aluminum flake to reduce the effects of EMI and RFI. Shielding layer 200 is electrically connected to solder bumps 154 and thermally contacts the backside of semiconductor die 156. Shielding layer 200 is electrically connected to a low-impedance ground point through conductive layer 152 and solder bumps 154 and 176. The conformal shielding layer 200 acts as a heat spreader for distribution and dissipation of heat generated by semiconductor die 156.

Figure 6B:
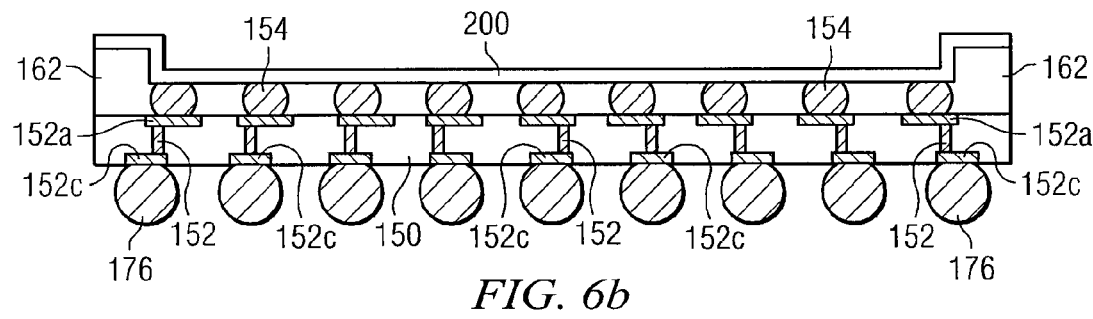

FIG. 6b is a cross-sectional view taken through shielding layer 200 in channel 168. Since encapsulant 162 is deposited before shielding layer 200, the shielding layer presents no obstacle to the flow of encapsulant 162 over semiconductor die 156. No voids are formed in the encapsulant as found in the prior art. Shielding layer 200 is more reliable and has less chance of delamination from the encapsulant. Shielding layer 200 has reliable joint connection to the external ground point.

Figure 7A:
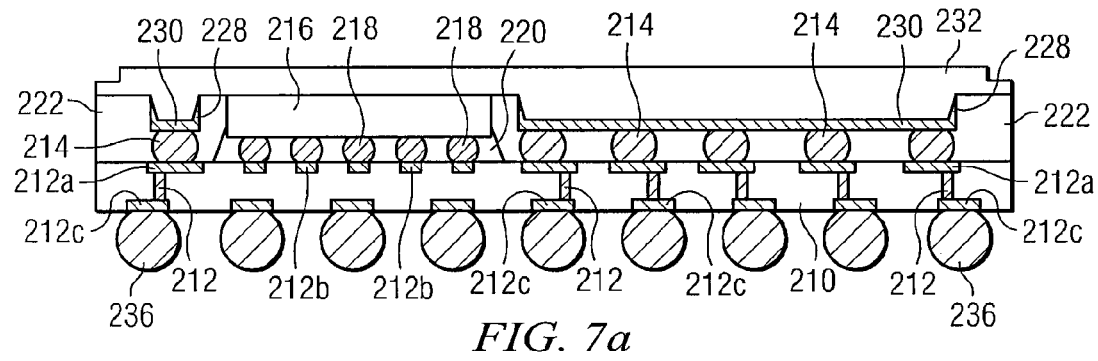
FIGS. 7a-7b illustrate the shielding layer mounted over a plurality of semiconductor die.
Figure 7B:
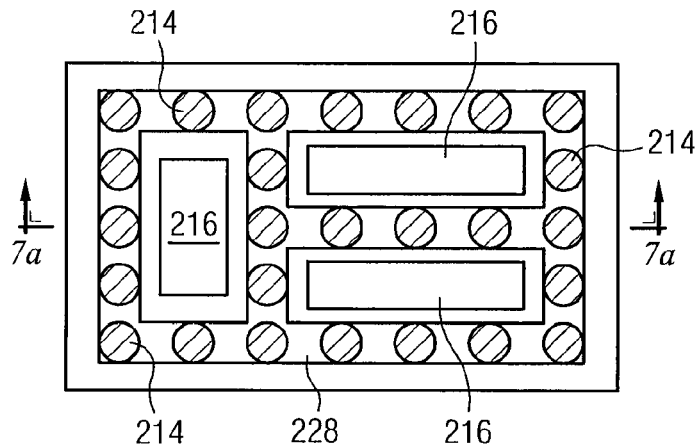

FIGS. 7a-7b illustrate an alternate process of forming the semiconductor device with a shielding layer mounted over semiconductor die after encapsulation. In FIG. 7a, a substrate or carrier 210 contains base material such as silicon, metal leadframe, ceramic, tape, or other suitable rigid material for structural support. An electrically conductive layer 212 is formed within substrate 210 using patterning with PVD, CVD, sputtering, electrolytic plating, electroless plating process, or other suitable metal deposition process. Conductive layer 212 can be one or more layers of Al, Cu, Sn, Ni, Au, Ag, or other suitable electrically conductive material. Conductive layer 212 provides signal traces and contact pads for electrical interconnect which are electrically common or electrically isolated depending on the functional design of the device.

An electrically conductive solder material is deposited over contact pads 212a using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 214. In some applications, solder bumps 214 are reflowed a second time to improve electrical connection to contact pads 212a. Solder bumps 214 represent one type of interconnect structure that can be formed over contact pads 212a. The interconnect structure can also use conductive pillars, stud bump, micro bump, or other electrical interconnect.

A plurality of semiconductor die or components 216 is disposed over substrate 210 and electrically connected to conductive layer 212b with solder bumps 218, as shown in FIG. 7b. An optional underfill material 220 is deposited between semiconductor die 216 and substrate 210. Semiconductor die 216 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband analog circuits or digital circuits, such as DSP, ASIC, memory, or other signal processing circuit. Semiconductor die 216 may also contain IPD, such as inductors, capacitors, and resistors, for RF signal processing. Semiconductor die 216 can be a flipchip type device or wire bond type device. In another embodiment, a discrete component can be mounted over and electrically connected to conductive pads 212b.

The IPDs in semiconductor die 216 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other GSM communications, each balun dedicated for a frequency band of operation of the quad-band device.

A typical RF system requires multiple IPDs and other high frequency circuits in one or more semiconductor packages to perform the necessary electrical functions. The high frequency electrical devices generate or are susceptible to undesired EMI, RFI, or other inter-device interference, such as capacitive, inductive, or conductive coupling, also known as cross-talk, which can interfere with the operation of adjacent or nearby circuit elements.

An encapsulant or molding compound 222 is deposited over carrier 210, semiconductor die 216, and around solder bumps 218 using a paste printing, compressive molding, transfer molding, liquid encapsulant molding, vacuum lamination, or other suitable applicator. Encapsulant 222 can be polymer composite material, such as epoxy resin with filler, epoxy acrylate with filler, or polymer with proper filler. Encapsulant 222 is non-conductive and environmentally protects the semiconductor device from external elements and contaminants.

A portion of encapsulant 222 is removed to planarize its surface with a backside of semiconductor die 216. Alternatively, the volume deposition of encapsulant 222 is controlled to a thickness that is planar with the backside of semiconductor die 216.

Another portion of encapsulant 222 is removed to form groove or channel 228 down to solder bump 214 using a saw blade or FAM. FIG. 7b shows a top view of the structure formed by FAM prior to mounting the shielding layer. Solder bumps 214 are formed around each of the semiconductor die 216. An electrically conductive layer 230 is formed within channel 228 using patterning with PVD, CVD, sputtering, electrolytic plating, electroless plating process, or other suitable metal deposition process. Conductive layer 230 can be one or more layers of Al, Cu, Sn, Ni, Au, Ag, or other suitable electrically conductive material. Alternatively, conductive layer 230 is a conductive paste that partially fills channel 228. Conductive layer 230 is electrically connected to solder bumps 214.

An electrically conductive solder material is deposited over contact pads 212c using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 236. In some applications, solder bumps 236 are reflowed a second time to improve electrical connection to contact pads 212c. Solder bumps 236 represent one type of interconnect structure that can be formed over contact pads 212c. The interconnect structure can also use conductive pillars, stud bump, micro bump, or other electrical interconnect.

To reduce inter-device interference, a shielding layer 232 is formed over or mounted to the planar surfaces of encapsulant 222 and semiconductor die 216. Shielding layer 232 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 232 can also be a non-metal material such as carbon-black or aluminum flake to reduce the effects of EMI and RFI. Shielding layer 232 is electrically connected to conductive layer 230 and thermally contacts the backside of semiconductor die 216. Shielding layer 232 is electrically connected to a low-impedance ground point through conductive layers 212 and 230 and solder bumps 214 and 236.

Figure 8:
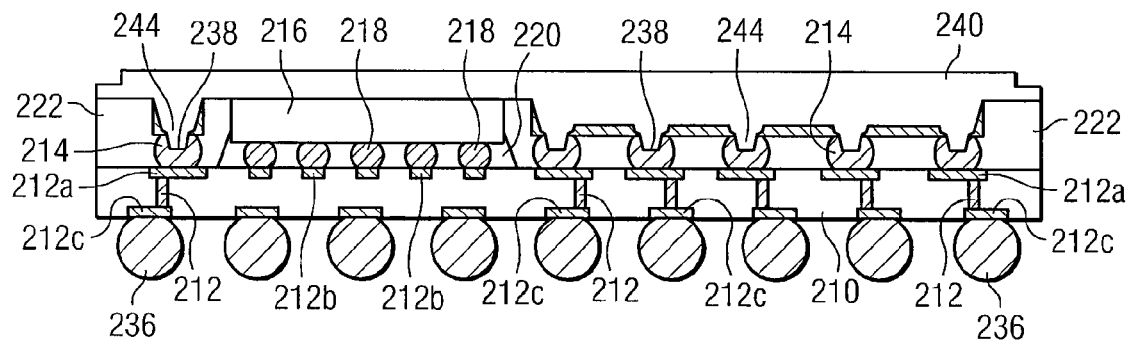
FIG. 8 illustrates the shielding layer mounted to the solder bumps with docking pins.

In another embodiment of FIGS. 7a-7b, a deeper channel 238 is cut into solder bumps 214, as shown in FIG. 8. Shielding layer 240 is formed over or mounted to encapsulant 222 and semiconductor die 216. Shielding layer 240 has docking pins 244 for locking into solder bumps 214 to form a reliable connection. Shielding layer 240 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 240 can also be a non-metal material such as carbon-black or aluminum flake to reduce the effects of EMI and RFI. Shielding layer 240 is electrically connected to solder bumps 214 through channel 238 and thermally contacts the backside of semiconductor die 216. Shielding layer 240 is electrically connected to a low-impedance ground point through conductive layers 212 and solder bumps 214 and 236.

Figure 9:
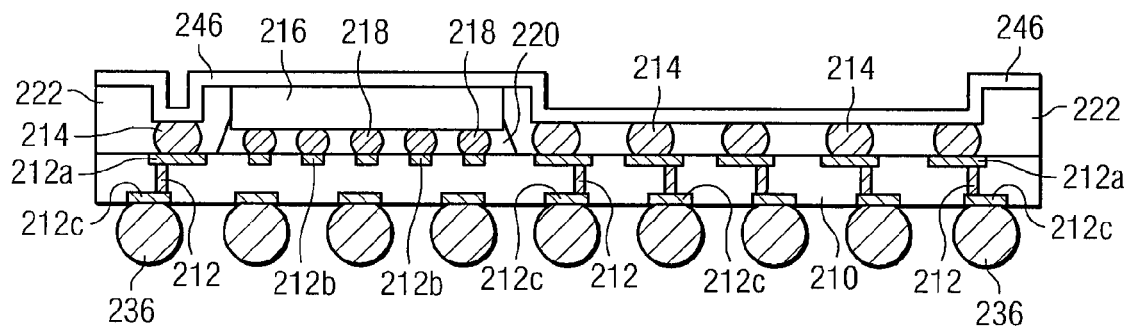
FIG. 9 illustrates the shielding layer conformally applied over the encapsulant and semiconductor die.

In another embodiment of FIGS. 7a-7b, a shielding layer 246 is conformally applied over semiconductor die 216 and encapsulant 222 into channel 228 by spray coating, electroless plating, or electro plating, as shown in FIG. 9. Shielding layer 246 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 246 can also be a non-metal material such as carbon-black or aluminum flake to reduce the effects of EMI and RFI. Shielding layer 246 is electrically connected to solder bumps 214 and thermally contacts the backside of semiconductor die 216. Shielding layer 246 is electrically connected to a low-impedance ground point through conductive layers 212 and solder bumps 214 and 236. The conformal shielding layer 246 acts as a heat spreader for distribution and dissipation of heat generated by semiconductor die 216.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a substrate having a conductive bump formed over the substrate and a semiconductor die with an active surface oriented to the substrate;
   depositing an encapsulant over the semiconductor die and the conductive bump;
   planarizing the encapsulant to expose a back surface of the semiconductor die opposite the active surface while leaving the encapsulant covering the conductive bump; and
   forming a channel into the encapsulant to expose the conductive bump, the channel extending vertically from a surface of the encapsulant down through the encapsulant and into a portion of the conductive bump, the channel extending through the encapsulant horizontally along a length of the semiconductor die.

2. The method of claim 1, further comprising forming a shielding layer over the encapsulant and the back surface of the semiconductor die, the shielding layer including a docking pin extending into the channel of the encapsulant and into the portion of the conductive bump to electrically connect to the conductive bump and provide isolation from inter-device interference.

3. The method of claim 2, wherein the shielding layer directly contacts the encapsulant and the back surface of the semiconductor die.

4. The method of claim 1, further comprising forming a chamfer area around the shielding layer.

5. The method of claim 1, further comprising conformally applying the shielding layer over the encapsulant and semiconductor die and into the channel.

6. The method of claim 1, further comprising forming the channel in the encapsulant using a saw blade, film assist molding, or laser ablation.

7. A method of manufacturing a semiconductor device, comprising:
   providing a substrate having an interconnect structure formed over the substrate and a semiconductor component mounted to the substrate;
   depositing an encapsulant over the semiconductor component and interconnect structure; and
   forming a channel into the encapsulant to expose the interconnect structure, the channel extending vertically from a surface of the encapsulant down through the encapsulant and into a portion of the interconnect structure, the channel extending through the encapsulant horizontally along a length of the semiconductor component.

8. The method of claim 7, further comprising forming a shielding layer over the encapsulant and the semiconductor component, the shielding layer including a docking pin extending into the portion of the interconnect structure to electrically connect to the interconnect structure and provide isolation from inter-device interference.

9. The method of claim 8, further comprising depositing conductive paste in the channel prior to forming the shielding layer.

10. The method of claim 7, further comprising forming a chamfer area around the shielding layer.

11. The method of claim 7, wherein the interconnect structure comprises a conductive bump.

12. The method of claim 7, wherein forming the shielding layer comprises conformally applying the shielding layer over the encapsulant and the semiconductor die and into the channel.

13. A method of manufacturing a semiconductor device, comprising:
   depositing an encapsulant over an interconnect structure and over a semiconductor component, the interconnect structure and the semiconductor component disposed over a substrate;
   forming a channel in the encapsulant to expose the interconnect structure, the channel extending vertically from a surface of the encapsulant down through the encapsulant to the interconnect structure, the channel extending through the encapsulant horizontally along a length of the semiconductor component; and
   forming a shielding layer over the encapsulant, the shielding layer electrically connected to the interconnect structure.

14. The method of claim 13, wherein the shielding layer extends into the channel of the encapsulant horizontally along the length of the semiconductor component.

15. The method of claim 13, wherein the interconnect structure is electrically connected to a conductive layer within the substrate.

16. The method of claim 13, wherein the interconnect structure comprises a conductive pillar.

17. The method of claim 13, further comprising, after forming the channel in the encapsulant, depositing a conductive paste in the channel.

18. The method of claim 13, further comprising forming a docking pin on the shielding layer which extends into the channel and electrically connects to the interconnect structure.

19. The method of claim 13, wherein forming the shielding layer comprises conformally applying the shielding layer over the encapsulant and the semiconductor die and into the channel.

20. The method of claim 13, further comprising distributing heat generated by the semiconductor component across the shielding layer.

21. A semiconductor device, comprising:
   a substrate;
   an interconnect structure disposed over the substrate;
   a semiconductor component mounted to the substrate;
   an encapsulant deposited over the semiconductor component and the interconnect structure;
   a channel disposed in the encapsulant, the channel extending vertically from a surface of the encapsulant down to the interconnect structure, the channel extending horizontally along a length of the semiconductor component; and
   a shielding layer disposed over the encapsulant and semiconductor component, the shielding layer electrically connected to the interconnect structure to provide isolation from inter-device interference.

22. The semiconductor device of claim 21, wherein the shielding layer extends into the channel of the encapsulant horizontally along the length of the semiconductor component.

23. The semiconductor device of claim 21, further comprising a conductive layer disposed in the substrate, the interconnect structure electrically connected to the conductive layer.

24. The semiconductor device of claim 21, further comprising a chamfered area formed around a perimeter of the shielding layer.

25. The semiconductor device of claim 21, wherein the interconnect structure comprises a stud bump or a micro bump.

26. The semiconductor device of claim 21, further comprising a docking pin disposed on the shielding layer, the docking pin extending into the channel and electrically connecting to the interconnect structure.

27. The semiconductor device of claim 21, wherein the shielding layer is conformally applied over the encapsulant and semiconductor die and into the channel.

* * * * *